United States Patent [19]
Burton, Jr. et al.

[11] Patent Number: 5,119,321
[45] Date of Patent: Jun. 2, 1992

[54] ADAPTIVE THRESHOLD SUPPRESSION OF IMPULSE NOISE

[75] Inventors: Willie T. Burton, Jr.; Brent A. Myers, both of Palm Bay; William W. Wiles, Jr., W. Melbourne, all of Fla.

[73] Assignee: Harris Corporation, Melbourne, Fla.

[21] Appl. No.: 523,020

[22] Filed: May 14, 1990

[51] Int. Cl.$^5$ .............................................. H03F 1/26
[52] U.S. Cl. .............................. 364/574; 364/724.01; 364/572
[58] Field of Search ............... 364/572, 574, 575, 554, 364/724.01, 724.02, 486, 487

[56] References Cited

U.S. PATENT DOCUMENTS

| | | | |
|---|---|---|---|
| 4,308,098 | 12/1981 | Neuner et al. | 364/574 X |
| 4,314,347 | 2/1982 | Stokely | 364/574 |
| 4,352,094 | 9/1982 | Reneric | 364/575 X |
| 4,665,499 | 5/1987 | Zackarski et al. | 364/574 X |
| 4,684,922 | 8/1987 | Minogue | 364/575 X |
| 4,750,156 | 7/1988 | Abrams et al. | 367/42 |
| 4,773,022 | 9/1988 | Melville et al. | 364/487 |
| 4,817,026 | 3/1989 | Inoue et al. | 364/724.01 |
| 4,825,379 | 4/1989 | Luthra et al. | 364/487 |
| 4,982,193 | 1/1991 | Saul | 341/159 |

Primary Examiner—Joseph L. Dixon
Attorney, Agent, or Firm—Evenson, Wands, Edwards, Lenahan & McKeown

[57] ABSTRACT

Impulse noise suppression upstream of digital processing circuitry contains a sample and hold mechanism which samples the input signal and stores a plurality of sequential sample values respectively representative of the amplitude of the input signal at successive sample times. The contents of the sample and hold mechanism are compared with an input signal sample to determine whether or not the there are abnormal amplitude variations which potentially constitute impulse noise. In one embodiment the comparison is referenced to the average magnitude of the input signal. In another embodiment the input signal is coupled to a cascaded arrangement of sample and hold circuits which sample and store a plurality of sequential sample values. The time differentials between successive sampling times are such there is little likelihood of occurrences of impulse noise spikes during any two successive sample intervals. The contents of the last sample and hold circuit of the cascaded plurality are compared with the contents of each of selected other sample and hold circuits of the cascaded chain. If the (earliest in time) sampled value stored in the last sampled and hold circuit is determined to be larger (by a system thermal noise offset) than the sampled value of any of the selected samples, then this sample is identified as being a potential noise impulse sample and is prevented from being coupled to downstream processing circuitry. Otherwise it is coupled through a downstream lowpass filter for subsequenty signal analysis.

21 Claims, 3 Drawing Sheets

ADAPTIVE THRESHOLD SUPPRESSION OF IMPULSE NOISE

FIELD OF THE INVENTION

The present invention relates in general to signal processing systems and is particularly directed to a mechanism for suppressing high amplitude impulse noise spikes that may be superimposed on a monitored signal of interest that is to be quantized and analyzed by a downstream digital signal processor.

BACKGROUND OF THE INVENTION

In many signal processing systems, particularly those which employ one or more transducers that are subject to anomalous inputs from their observation environment, the signal waveform of interest may be impacted by randomly occurring noise impulses or artifacts having a peak amplitude that may be orders of magnitude in excess of that of the expected waveform and have extremely fast rise and fall times compared to the rate of change of the signal of the monitored signal. One non-limitative example is the contamination of low level electrical signal currents by large exponentially distributed amplitude current spikes, which may be Poisson-distributed in time on the input waveform. In such a case, it can be shown that the mean and variance of displaced electrons due to noise impulses are given by the expressions:

$$Mi = nNo, \text{ and} \quad (1)$$

$$\sigma i = No\sqrt{2n} . \quad (2)$$

where
- $Mi$ = Mean number of displaced electrons,
- $\sigma i$ = Standard deviation of displaced electrons,
- $No$ = Average number of electrons in a set of impulses, and
- $n$ = Probability that an impulse occurs in a given time interval.

The quantities No and n are dependent on many factors relating to the physical nature of the noise source, with typical values for No being 20,000 to 40,000 electrons. The value of n, on the other hand, is a function of the physical design of the sensing system utilized. For an optoelectronic transducer having a focal plane detector area of Ad, the value on n may be defined as:

$$n = Ad t_i g k_s \quad (3)$$

where:
- $t_i$ = detector integration time,
- $g$ = noise flux density, and
- $k_s$ = scattering factor.

The variable $t_i$ requires further explanation. A conventional technique of converting low level currents to signal voltages is to integrate the current for a fixed length of time ($t_i$). The output voltage is directly proportional to the current and integration time. This method of transimpedance amplification is known as reset integration. As can be seen from equation (3), the longer the integration time, the more likely a noise contaminated pulse will occur. The scattering factor ks is a function of the configuration of the detector. Typical values of n range from 0.1 to 0.5. A value of n=0.1 implies that out of ten sequential time periods of length $t_i$, one time period on the average will contain an impulse of noise current. Based on these values along with assumed numbers for No, a range of induced noise levels can be defined using equations (1) and (2), as:

$$2000 < Mi < 20,000 \text{ (electrons), and}$$

$$9000 < \sigma i < 40,000 \text{ (electrons)}.$$

Signal detection in many applications requires resolution of as few as 300 electrons in an integration time interval. Obviously, with noise levels of 9000 electrons, a method of noise (impulse) attenuation is necessary if successful detection is to take place. Further, since sensor system amplifications imply large numbers of input signals, the method employed must be efficient.

With reference to equation (3), one conventional method of impulse noise reduction is to minimize detector area and shorten the integration time of the transimpedance amplifier. This will reduce the event rate but have little effect on the impulse amplitude. Generally, for very small signal currents, this technique has proven inadequate.

A second method, diagrammatically shown in FIG. 1, involves connecting a simple low pass filter 2 at the output of a transimpedance amplifier 1. Since a transimpedance amplifier is a sampling circuit (it is periodically reset to begin a new integration period), the low pass filter may be a sampled data filter implemented with switched capacitor components. It can be shown that the noise at the output of the low pass filter may be defined by the expressions:

$$Mo = nNo, \text{ and} \quad (4)$$

$$\sigma o = No\sqrt{2\pi n \frac{fc}{fs}} , \quad (5)$$

where Mo and $\sigma o$ are output mean and standard deviation of the noise, fc is the filter cut-off frequency and fs is the reset sampling frequency equal to $1/t_i$. The value of fc is set by the desired signal bandwidth. In cases where the signal bandwidth is much less than the impulse event rate, comparing equation (5) to equation (2) reveals a significant amount of attenuation. This method works well if fc can be made small as compared to fs.

A third approach centers around a digital processing solution, diagrammatically illustrated in FIG. 2. Since there are N multiple diodes in a photodetector array, the outputs of their associated transimpedance amplifiers 1-1 . . . 1-N are sampled via respective sample and hold circuits 3-1 . . . 3-N and selectively coupled by way of a multiplexer 4 to an analog-digital converter (ADC) 5 (or set of ADCs if parallel processing is used). Each channel is digitally demultiplexed in demultiplexer 6 and the following sequence of steps (S1)–(S6) is carried out within an associated digital processor 7 to remove impulse noise.

(S1) N consecutive samples are retained from each detector;

(S2) Compare the N samples and choose the smallest value (assuming that it is free of contamination (due to impulse noise);

(S3) Add a small value Vo representative of system thermal noise to the smallest sample to generate a signal threshold Vt;

(S4) Compare each sample value Vs to the threshold Vt;

(S5) Discard the samples exceeding the threshold; and (S6) Sum the remaining samples to enhance signal gain.

Although this technique can provide significant reduction in impulse noise, its implementation suffers from a number of problems. First of all, it is necessary that the sampling rate be fast enough to prevent one or more samples from being contaminated with noise impulses. For a large numbers of detectors this places an enormous burden on the A-D converter. For example, a $128 \times 128$ diode array sampled at 10 KHz requires an analog to digital conversion rate of 163.84 MHz. If twelve bit resolution is required (which is typical), such a converter is well beyond the current state of the art. While parallel processing is possible, the number of A-D converters may be prohibitively large and unreasonable due to size constraints. The output data rate at the multiplexer would be very high, as well placing a very difficult settling requirement on the output driver. Combining the data rate requirement and number of A-D converters necessary would result in substantial power dissipation, which is highly undesirable in environments such as focal plane arrays where cold temperatures must be maintained.

A third problem relates to the digital storage required to implement the process. Further, the digital processor must run at rates consistent with noise contamination rather than at the Nyquist rate of the desired signal. Finally, since the uncontaminated samples are summed as the last step (S6) of the process, the overall gain of the system is dependent upon the statistics of the noise This implies the need for an additional correction mechanism, which further complicates the process.

SUMMARY OF THE INVENTION

In accordance with the present invention, rather than conduct impulse noise suppression within a digital signal processor, which imposes a substantial speed, resolution and memory requirement to handle impulse noise artifacts in the input signal to be processed, a prefiltering of the input signal is carried out to remove or substantially suppress impulse noise upstream of the analog-digital conversion and processing circuitry, based upon an analysis of successive samples of the input signal. The effect of this prefiltering mechanism is to reduce the amplitude and frequency of occurrence of noise impulses, so that the resultant signal removes the above-mentioned burden on downstream digital processing equipment.

To this end, the front end of the pre-processing filter of the present invention contains a sample and hold mechanism which successively samples the input signal and stores a plurality of sequential sample values respectively representative of the amplitude of the input signal at successive sample times. The contents of the sample and hold mechanism are compared with an input signal sample to determine whether or not the contents of the sample and hold mechanism satisfy a predetermined relationship with the input signal sample. The purpose of the comparison is to identify abnormal amplitude variations which potentially constitute impulse noise.

Pursuant to a first embodiment of the invention the comparison is referenced to the average magnitude of the input signal. Specifically, a running average of the magnitude of the contents of the sample and hold mechanism is compared with the current value of the input signal. The average value may be determined by coupling the output of the sample and hold mechanism through a low pass filter. If the current value of the input signal exceeds the average value (taking into account system thermal noise), the input signal sample is identified as being a potential noise impulse sample and is prevented from being coupled to downstream processing circuitry. Otherwise it is coupled to through a prescribed signal processing operator (lowpass filter) to digital conversion and processing components.

In accordance with a second embodiment of the invention, the input signal is coupled to a cascaded arrangement of sample and hold circuits which sample and store a plurality of sequential sample values respectively representative of the amplitude of the input signal at successive sample times. The time differentials between successive sampling times are such there is little likelihood of occurrences of impulse noise spikes during any two successive sample intervals. (The likelihood is even less as the number of successive intervals is increased). The contents of the last sample and hold circuit of the cascaded plurality are compared with the contents of each of selected other sample and hold circuits of the cascaded chain. If the (earliest in time) sampled value stored in the last sampled and hold circuit is determined to be larger (by a system thermal noise offset) than the sampled value of any of the selected samples, then this sample is identified as being a potential noise impulse sample and is prevented from being coupled to downstream processing circuitry. Otherwise it is coupled to through a prescribed signal processing operator (a downstream lowpass filter) to digital conversion and processing components, as in the first embodiment.

DETAILED DESCRIPTION

Figure 1:
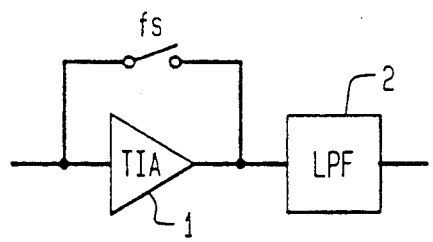
FIG. 1 diagrammatically shows a prior art technique of connecting a simple low pass filter at the output of a transimpedance amplifier to reduce impulse noise.

Before describing in detail the particular adaptive threshold impulse noise suppression mechanism in accordance with the present invention, it should be observed that the present invention resides primarily in a novel structural combination of conventional signal processing and components and not in the particular detailed configurations thereof. Accordingly, the structure, control and arrangement of these conventional circuits and components have been illustrated in the drawings by readily understandable block diagrams which show only those specific details that are pertinent to the present invention, so as not to obscure the disclosure with structural details which will be readily apparent to those skilled in the art having the benefit of the description herein. Thus, the block diagram illustrations of the Figures do not necessarily represent the mechanical structural arrangement of the exemplary system, but are primarily intended to illustrate the major structural components of the system in a convenient functional grouping, whereby the present invention may be more readily understood.

Figure 3:
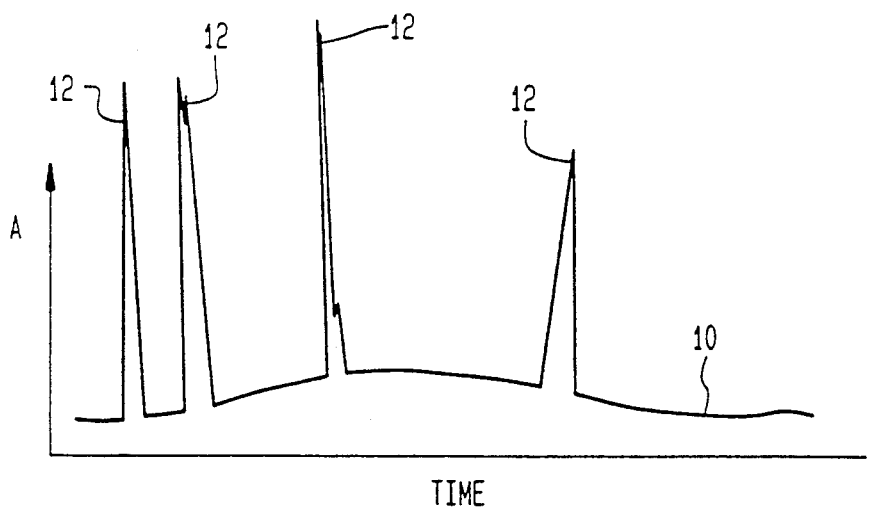
FIG. 3 shows a signal waveform having a varying signal amplitude characteristic representative of a fluctuation in the stimulus to a transducer subject to impulse noise.
Figure 2:
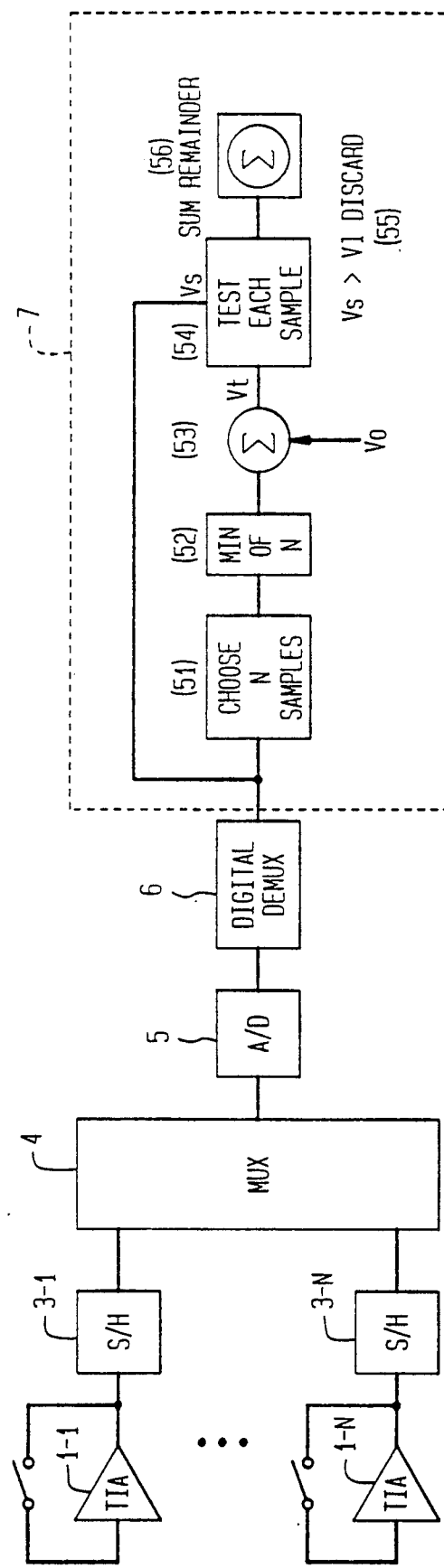
FIG. 2 diagrammatically shows a conventional digital processing scheme for reducing impulse noise in a multi-component transducer system.

Referring now to FIG. 3 a signal waveform, such as that produced by a condition-monitoring transducer (such as a conventional opto-electronic transducer of a multi-element photo array), is shown as having a varying signal amplitude characteristic 10 representative of a fluctuation in the stimulus to the transducer resulting from a prescribed monitored parameter. In the absence of ambient anomalies in the environment from which the input stimulus to the transducer is produced, the amplitude and frequency of the signal waveform can be expected to fall within reasonably defined signal processing boundaries, so that the requirements of a downstream digital processor can be specified. However, as noted above, it is often the case that, because the transducers from which such waveforms are derived are subject to anomalous inputs from their observation environment, a signal waveform of interest may be impacted by randomly occurring noise impulses 12 having peak amplitudes that may be orders of magnitude in excess of that of the expected waveform and having extremely fast rise and fall times compared to the rate of change of the signal.

Because of the random times of occurrence of such noise impulses, it can be reasonably predicted that if the signal of interest is sampled at a fast enough rate, the probability of noise impulses occurring in two consecutive sampling windows is extremely small. Pursuant to a first embodiment of the invention, this aspect of such impulse noise spikes is used to controllably suppress samples of an input signal of interest the magnitude of which exceeds that of one or more selected samples taken at successive sample times.

Figure 4:
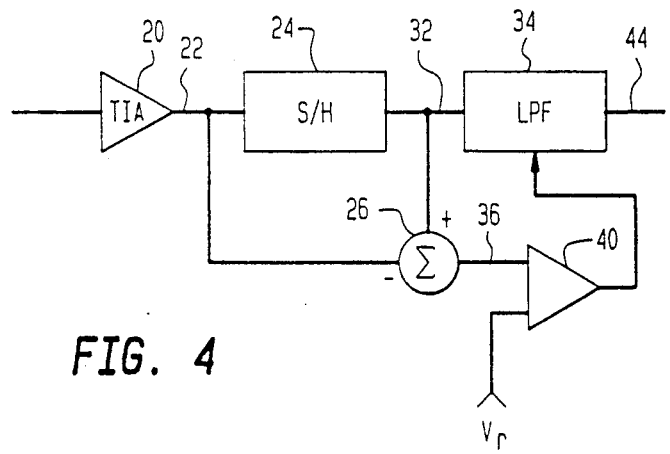
FIG. 4 shows an embodiment of the invention which operates in accordance with the magnitudes of two sequential signal samples.

FIG. 4 shows an embodiment of the invention which operates in accordance with the magnitudes of two sequential signal samples. The output of a transducer (not shown) that may be subject to the noise impulse anomalies is coupled to a transimpedance amplifier 20, the output 22 of which is coupled to a sample and hold circuit 24 and to a first input of a subtraction circuit 26. The sampling rate of sample and hold circuit 24 is selected with a priori knowledge of the type of impulse noise to be suppressed so that the sampling rate is such that the probability of impulse noise occurring in two successive sample intervals is remote. A second input of subtraction circuit 26 is coupled to the output 32 of sample and hold circuit 24, which output is further coupled to a switched low pass filter 34. The output 36 of subtraction circuit 26 is coupled to one input of a hysteresis comparator 40, a second input of which is coupled to a prescribed voltage reference Vr. The internal hysteresis window of comparator 40 is set to some multiple of a system thermal noise floor to provide good noise immunity. The output 42 of comparator 40 is representative of whether or not the magnitude of the input signal as supplied by transimpedance amplifier 20 is less than the magnitude of the signal sample stored in sample and hold circuit 24 by the hysteresis threshold. As long as the difference between successive signal samples falls within the hysteresis window of comparator 40, the output of sample and hold circuit 24 is coupled through low pass filter 34 to an output link 44. However, should the magnitude of the value of stored in sample and hold circuit 24 exceed the magnitude of the current output of transimpedance amplifier 20, implying that the current sample value may represent a noise impulse value, the output of sample and hold circuit 24 is decoupled from low pass filter 34, so that this sample is effectively suppressed.

In accordance with an expanded modification of the embodiment of the invention shown in FIG. 5, rather than compare the magnitudes of the input signal for only two successive sample times, the magnitude of the next sample value to be controllably filtered is compared with the magnitudes of each of a plurality of subsequently sampled signal values. If the magnitude of any of these subsequent values is less than the comparison hysteresis window, then the sample of interest is not coupled to the low pass filter of subsequent processing.

Figure 5:
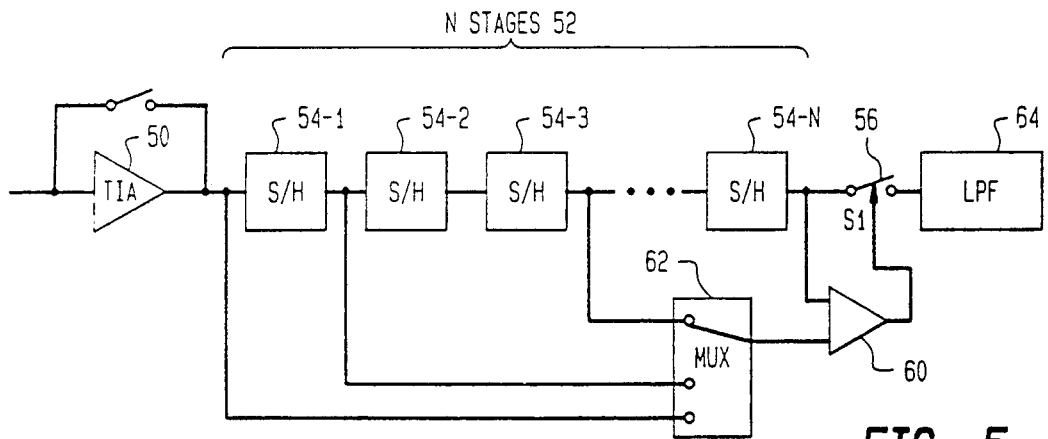
FIG. 5 shows an expanded modification of the embodiment of the invention shown in FIG. 4.

For this purpose, as shown in FIG. 5, the output of a transimpedance amplifier 50 (which is coupled to an upstream transducer (not shown)) is coupled to a cascaded arrangement 52 of sample and hold circuits 54-1 ... 54-M, which sample and store a plurality of sequential sample values respectively representative of the magnitude of the output of transimpedance amplifier 50 at successive sampling times. As pointed out earlier, the time differentials between successive sampling times among sample and hold circuits 54 are selected based upon the known rate of occurrence of the impulse noise to be suppressed. The sampling rate is selected so that there is little likelihood of occurrences of impulse noise spikes during successive sample intervals. For increasing values of M, the likelihood is even less.

The contents of the last sample and hold circuit 54-M of the cascaded arrangement 52 are coupled to a controlled switch 56 and to one input of a differential comparator 60. A second input of comparator 60 is coupled to the output of a multiplexer 62, J plural inputs of which are coupled to J plural ones of the M sample and hold circuits, where J is less than or equal to M. For a respective sampling interval, by means of an input scan control clock (not shown), multiplexer 62 successively couples each of its inputs to comparator 60, so that the contents of sample and hold circuit 24-M will be compared with the contents of each of selected other sample and hold circuits of cascaded arrangement 52. If the (earliest in time) sampled value stored in sample and hold circuit 24-M is larger (by a system thermal noise offset) than the sampled value of any of the samples scanned by multiplexer 62, then comparator 60 produces an output which holds switch 56 open, so that the contents of sample and hold circuit 24-M are prevented from being coupled to downstream processing circuitry. Otherwise, switch 56 is closed, so that the contents of sample and hold circuit 24-M are coupled through a lowpass filter 64 to downstream digital conversion and processing circuitry. This prefiltering of the sampled data serves to identify abnormal amplitude variations which potentially constitute impulse noise, so that such variations may be controllably suppressed and not coupled to low pass filter 64, thereby reducing the amplitude and frequency of occurrence of noise impulses, and removing the above-mentioned burden on downstream digital processing circuitry, including the complexity of the analog-to-digital conversion circuitry, capacity of the output driver and substantial memory required by the processor.

Figure 6:
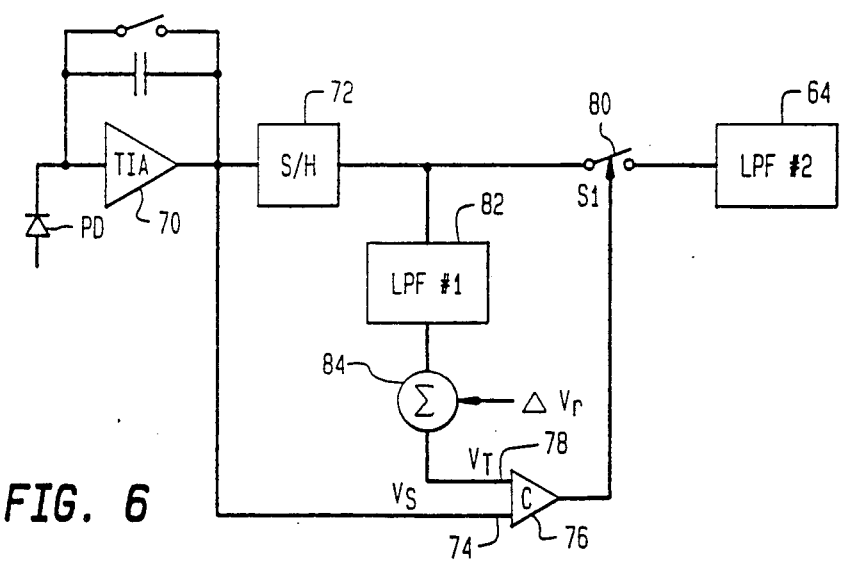
FIG. 6 diagrammatically shows a further embodiment of the invention having an adaptive threshold based upon an averaging of the input signal.

Pursuant to a further embodiment of the invention, diagrammatically illustrated in FIG. 6, rather than base the controlled suppression of impulse noise on the probability that two or more successive signal samples will not be corrupted, so that a determination can be based upon a comparison of the value of the sample to be controllably passed to downstream processing circuitry with its immediately successive sample or with a plurality of subsequent samples, the comparison is a referenced to the average magnitude of the input signal. A running average of the magnitude of the contents of the sample and hold mechanism is compared with the current value of the input signal. If the current value of the input signal exceeds the average value (taking into account system thermal noise), the input signal sample is identified as being a potential noise impulse sample and is prevented from being coupled to downstream processing circuitry. Otherwise it is coupled to through a prescribed signal processing operator (lowpass filter) to digital conversion and processing components.

For this purpose, FIG. 6 shows a transimpedance amplifier 70 having its output coupled to a sample and hold circuit 72 and to a first 74 of a differential comparator 76. The output of sample and hold circuit 72 is coupled to a controlled switch (gate) and to a first, 'threshold' lowpass filter 82, the bandwidth of which is chosen in accordance with the bandwidth of the monitored signal of interest. Lowpass filter 82 serves to determine the average value of the contents of sample and hold circuit 72. Its output is coupled to a summing circuit 84 where an offset value delta Vt, corresponding to a prescribed multiple of the standard deviation of the system thermal noise (assumed to be Gaussian), is added to the average value output by lowpass filter 82, to obtain an adaptive threshold reference Vt, which is coupled to a second input 78 of comparator 76. The output of comparator 76 is coupled as a control or gating input to switch 80, the output of which is coupled to a downstream lowpass filter 86.

As long as the value of the output of transimpedance amplifier 70 (corresponding to the currently sample value) is less than the adaptive threshold Vt produced by adder 82 (which is based upon a long term average of the input signal), comparator 76 keeps switch 80 closed, so that the output of sample and hold circuit 72 may be coupled to lowpass filter 86. On the other hand, if the value of the output of transimpedance amplifier 70 is greater than or equal to the adaptive threshold Vt produced by adder 82, the current sample is identified as a potential noise spike and comparator 76 holds switch 80 open, so that the output of sample and hold circuit 72 is prevented coupled through lowpass filter 86 to downstream digital processing circuitry, thereby effectively suppressing potential noise impulses.

As will be appreciated from the foregoing description, by means of a 'prefiltering' impulse noise suppression mechanism inserted in the signal processing path upstream of the digital signal processor, the present invention is able to reduce the substantial speed, resolution and memory requirement placed upon conventional digital processing components. The prefiltering of the input signal operates on successive samples of the input signal using a mechanism that may be either probabilistic or stochastic to reduce the amplitude and frequency of occurrence of noise impulses, so that the parameters of the resultant signal permit it to be readily accepted by normally employed digital processing hardware.

While we have shown and described several embodiments in accordance with the present invention, it is to be understood that the same is not limited thereto but is susceptible to numerous changes and modifications as known to a person skilled in the art, and we therefore do not wish to be limited to the details shown and described herein but intend to cover all such changes and modifications as are obvious to one of ordinary skill in the art.

What is claimed:

1. For use with a signal processing apparatus in which an input signal to be processed may contain signal anomalies having amplitudes which are significantly greater than that of said input signal, a method of controllably suppressing said signal anomalies comprising the steps of:
   (a) sampling said input signal to generate a plurality of input signal samples;
   (b) storing successive ones of said plurality of input signal samples and producing a first signal representative of the stored samples;
   (c) comparing said input signal with said first signal and generating a second signal in response to said input signal satisfying a predetermined relationship with said first signal; and
   (d) selectively coupling said first signal to a prescribed signal processing operator in response to said second signal, said prescribed signal processing operator generating an output signal representative of said input signal with said signal anomalies suppressed.

2. A method according to claim 1, wherein step (c) comprises the steps of:
   (c1) generating a third signal representative of the average value of said first signal;
   (c2) combining said third signal with a prescribed offset value to produce a fourth signal; and
   (c2) generating said second signal in accordance with the relative magnitudes of said input signal and said fourth signal.

3. A method according to claim 2, wherein step (c2) comprises generating said second signal in response to the magnitude of said input signal being less than or equal to the magnitude of said fourth signal.

4. A method according to claim 3, wherein step (d) comprises selectively coupling said first signal to a low pass filter in response to said second signal, but otherwise preventing said first signal from being coupled to said low pass filter, so that only during the time that the magnitude of said input signal is less than the magnitude of said fourth signal, said first signal is coupled to said low pass filter, so that said low pass filter produces an output signal with said signal anomalies suppressed representative of said input signal.

5. A method according to claim 1, wherein step (c) comprises:
   (c1) coupling said first signal to a first low pass filter which generates a third signal representative of the average value of said first signal;
   (c2) summing said third signal with a prescribed offset value to produce a fourth signal; and (c2) generating said second signal in response to the magnitude of said input signal being less than or equal to the magnitude of said fourth signal.

6. A method according to claim 5, wherein step (d) comprises
selectively coupling said first signal to a second low pass filter in response to said second signal, but otherwise preventing said first signal from being coupled to said second low pass filter, so that only during the time that the magnitude of said input signal is less than the magnitude of said fourth signal, said first signal is coupled to said second low pass filter, so that said second low pass filter produces an output signal representative of said input signal with said signal anomalies suppressed.

7. A method according to claim 1, wherein step (c) comprises the steps of:
(c1) generating a third signal representative of the difference between said input signal and said first signal; and
(c2) generating said second signal in accordance with the difference between said third signal and an offset reference level.

8. A method according to claim 7, wherein step (d) comprises
selectively coupling said first signal to a low pass filter in response to said second signal, but otherwise preventing said first signal from being coupled to said low pass filter, so that only during the time that the magnitude of said input signal is less than the magnitude of said fourth signal, said first signal is coupled to said low pass filter, so that said low pass filter produces an output signal representative of said input signal with said signal anomalies suppressed.

9. For use with a signal processing apparatus in which an input signal to be processed may contain randomly occurring noise impulses, amplitudes of which and the rate of change of which are significantly greater than the amplitude and the rate of change of said input signal, a method of controllably suppressing said noise impulses from said input signal, so that said input signal may be processed substantially free of said noise impulses, comprising the steps of:
(a) successively sampling said input signal so as to generate a plurality of sequential sample values respectively representative of the amplitude of said input signal at successive sample times;
(b) storing successive ones of said plurality of input signal samples;
(c) for each one of the stored sample values, comparing said one of the stored sample values with others of the stored sample values and generating a second signal in response to said one stored sample value satisfying a predetermined relationship with said other stored sample values; and
(d) selectively coupling said one stored sample value to a prescribed signal processing operator in response to said second signal, but otherwise preventing said one stored sample value from being coupled to said prescribed signal processing operator, the output of which is representative of said input signal effectively absent noise impulses.

10. A method according to claim 9, wherein step (c) comprises comparing said one of the stored sample values with previously sampled and stored values of said input signal and generating a second signal in response to said one stored sample value being greater than each of a plurality of previously sampled and stored values of said input signal.

11. A method according to claim 9, wherein step (d) comprises selectively coupling said one stored sample value to a low pass filter in response to said second signal, but otherwise preventing said one stored sample from being coupled to said low pass filter, so that during the time that the magnitude of said one stored signal sample is greater than the magnitude of each of said plural ones of previously sampled and stored values, said one sampled and stored value is coupled to said low pass filter, so that said low pass filter produces an output signal representative of said input signal effectively absent noise impulses.

12. For use with a signal processing apparatus in which an input signal to be processed may contain randomly occurring noise impulses, amplitudes of which and the rate of change of which are significantly greater than the amplitude and the rate of change of said input signal, a preprocessing selective filtering device which controllably suppresses noise impulses from said input signal, so that said input signal may be processed substantially free of said noise impulses comprising:
a sample and hold circuit coupled to receive said input signal, said sample and hold circuit producing successive samples of said input signal,;
first means, coupled to the output of said sample and hold circuit, for generating a first signal representative of the average value of the contents of said sample and hold circuit;
second means, coupled to receive said input signal and said first signal for comparing said input signal with said first signal and generating a second signal in response to said input signal satisfying a predetermined relationship with said first signal; and
third means for selectively coupling said sample and hold circuit to a prescribed signal processing operator in response to said second signal, said prescribed signal processing operator generating an output signal representative of said input signal with said noise impulses suppressed.

13. A device according to claim 12, wherein said second means comprises means for combining said first signal with a prescribed offset value to produce a third signal and means for generating said second signal in accordance with the relative magnitudes of said input signal and said third signal.

14. A device according to claim 13, wherein said second means comprises means for generating said second signal in response to the magnitude of said input signal being less than or equal to the magnitude of said third signal.

15. A device according to claim 14, wherein said third means includes means for selectively coupling the output of said sample and hold circuit to a low pass filter in response to said second signal, so as to obtain an output signal representative of said input signal, but otherwise preventing said sample and hold circuit from being coupled to said low pass filter, so that only during the time that the magnitude of said input signal is less than the magnitude of said third signal is said sample and hold circuit coupled to said low pass filter, so that said low pass filter produces an output signal representative of said input signal with said impulse noise effectively suppressed.

16. A device according to claim 12, wherein said first means comprises a first low pass filter which generates said first signal representative of the average value of the contents of said sample and hold circuit.

17. A device according to claim 16, wherein said second means comprises means for summing said first signal with a prescribed offset value to produce a third signal and means for generating said second signal in response to the magnitude of said input signal being less than or equal to the magnitude of said third signal.

18. A device according to claim 17, wherein said third means comprises means for selectively coupling the contents of said sample and hold circuit to a second low pass filter in response to said second signal, so as to obtain an output signal representative of said input signal, but otherwise preventing the contents of said sample and hold circuit from being coupled to said second low pass filter, so that only during the time that the magnitude of said input signal is less than the magnitude of said third signal are the contents of said sample and hold circuit coupled to said second low pass filter, so that said second low pass filter produces an output signal representative of said input signal with said noise impulse suppressed.

19. For use with a signal processing apparatus in which an input signal to be processed may contain randomly occurring noise impulses, amplitudes of which and the rate of change of which are significantly greater than the amplitude and the rate of change of said input signal, a device for controllably suppressing said noise impulses from said input signal, so that said input signal may be processed substantially free of said noise impulses, comprising:

a plurality of cascaded sample and hold circuits coupled to successively sample said input signal and store a plurality of sequential sample values respectively representative of the amplitude of said input signal at successive sample times;

first means, coupled to selected ones of said sample and hold circuits, for comparing one of the stored sample values with others of the stored sample values and generating a first signal in response to said one stored sample value satisfying a predetermined relationship with each of said other stored sample values; and second means for selectively coupling said one stored sample value to a prescribed signal processing operator in response to said first signal, but otherwise preventing said one stored sample value from being coupled to said prescribed signal processing operator, the output of which is representative of said input signal effectively absent noise impulses.

20. A device according to claim 19, wherein said second means comprises means for comparing said one of the stored sample values with previously sampled and stored values of said input signal and generating a first signal in response to said one stored sample value being greater than each of plural ones of previously sampled and stored values of said input signal.

21. A device according to claim 20, further comprising third means for selectively coupling said one stored sample value to a low pass filter in response to said first signal, but otherwise preventing said one stored sample from being coupled to said low pass filter, so that during the time that the magnitude of said one stored signal sample is greater than the magnitude of each of said plural ones of previously sampled and stored values, said one sampled and stored value is coupled to said low pass filter, so that said low pass filter produces an output signal representative of said input signal absent noise impulses.

* * * * *